(12) United States Patent
Mitarai

(10) Patent No.: US 6,864,295 B2
(45) Date of Patent: Mar. 8, 2005

(54) GAS-GENERATING, PRESSURE-SENSITIVE ADHESIVE COMPOSITION

(75) Inventor: Yoshiaki Mitarai, Ooita (JP)

(73) Assignee: Asahi Kasei Chemicals Corporation, Tokyo (JP)

(*) Notice: Subject to any disclaimer, the term of this patent is extended or adjusted under 35 U.S.C. 154(b) by 173 days.

(21) Appl. No.: 10/200,495

(22) Filed: Jul. 23, 2002

(65) Prior Publication Data

US 2004/0016504 A1 Jan. 29, 2004

(51) Int. Cl.[7] .............. C08J 9/00; C08J 3/28; B32B 7/12
(52) U.S. Cl. .......... 521/50.5; 522/18; 522/13; 522/28; 522/32; 522/65; 522/78; 522/168; 522/170; 522/144; 522/146; 522/134; 428/345; 428/355 EP; 428/355 AC
(58) Field of Search .............. 521/50.5; 428/345, 428/355 EP, 355 AC, 343; 522/13, 18, 28, 32, 65, 78, 144, 146, 134, 168, 170, 142, 166; 156/272.2, 275.5, 275.7, 327, 330.9, 331.1

(56) References Cited

U.S. PATENT DOCUMENTS

| | | | | |
|---|---|---|---|---|
| 4,483,978 A | * | 11/1984 | Manser | 528/408 |
| 4,919,737 A | * | 4/1990 | Biddle et al. | 149/19.5 |
| 5,164,521 A | * | 11/1992 | Manzara et al. | 552/10 |
| 5,187,007 A | | 2/1993 | Ebe et al. | |
| 5,278,023 A | * | 1/1994 | Bills et al. | 430/201 |
| 5,459,016 A | * | 10/1995 | Debe et al. | 430/201 |
| 5,665,822 A | * | 9/1997 | Bitler et al. | 525/92 C |
| 5,681,904 A | * | 10/1997 | Manzara | 525/404 |
| 5,792,579 A | * | 8/1998 | Phillips | 430/7 |
| 2001/0019765 A1 | | 9/2001 | Kiuchi et al. | |

FOREIGN PATENT DOCUMENTS

| | | |
|---|---|---|
| EP | 0 527 505 A2 * | 2/1993 |
| JP | 61-222733 | 10/1986 |
| JP | 63-17981 | 1/1988 |
| JP | 63-30581 | 2/1988 |
| JP | 63-33487 | 2/1988 |
| JP | 6-33025 | 2/1994 |
| JP | 7-142623 | 6/1995 |
| JP | 407145357 A * | 6/1995 |
| JP | 2000-86994 | 3/2000 |
| JP | 2000-349107 | 12/2000 |
| WO | WO 03/014242 A1 * | 2/2003 |
| WO | WO 03/042319 A1 * | 5/2003 |

* cited by examiner

Primary Examiner—Susan Berman
(74) Attorney, Agent, or Firm—Birch, Stewart, Kolasch & Birch, LLP

(57) ABSTRACT

Disclosed is a gas-generating, pressure-sensitive adhesive composition comprising a pressure-sensitive, ultraviolet irradiation-curable adhesive (A) containing a photoinitiator, wherein the adhesive (A) transmits therethrough an ultraviolet radiation, and a gas generator compound (B) which generates a gas upon irradiation thereof with an ultraviolet radiation, wherein the gas generator compound (B) is operably combined with the pressure-sensitive, ultraviolet irradiation-curable adhesive (A), so that, in operation, when the gas-generating, pressure-sensitive adhesive composition which is adhered to an adherend is irradiated with an ultraviolet radiation, the gas generator compound (B) generates a gas and the gas effuses at an interface between the gas-generating, pressure-sensitive adhesive composition and the adherend to thereby facilitate release of the adherend from the gas-generating, pressure-sensitive adhesive composition.

10 Claims, 2 Drawing Sheets

GAS-GENERATING, PRESSURE-SENSITIVE ADHESIVE COMPOSITION

BACKGROUND OF THE INVENTION

1. Field of the Invention

The present invention relates to a gas-generating, pressure-sensitive adhesive composition. More particularly, the present invention is concerned with a gas-generating, pressure-sensitive adhesive composition comprising: a pressure-sensitive, ultraviolet irradiation-curable adhesive (A) containing a photoinitiator, wherein the adhesive (A) transmits therethrough an ultraviolet radiation; and a gas generator compound (B) which generates a gas upon irradiation thereof with an ultraviolet radiation. In the gas-generating, pressure-sensitive adhesive composition of the present invention, the gas generator compound (B) is operably combined with the pressure-sensitive, ultraviolet irradiation-curable adhesive (A), so that, in operation, when the gas-generating, pressure-sensitive adhesive composition which is adhered to an adherend is irradiated with an ultraviolet radiation, the gas generator compound (B) generates a gas and the gas effuses at an interface between the gas-generating, pressure-sensitive adhesive composition and the adherend to thereby facilitate release of the adherend from the gas-generating, pressure-sensitive adhesive composition. Therefore, in the working (e.g., grinding or cutting) of an electronic part, such as a precision electronic part, a substrate for an electronic appliance, or a semiconductor part (e.g., a semiconductor wafer), when the gas-generating, pressure-sensitive adhesive composition of the present invention is used as an adhesive for temporarily attaching the electronic part to a substratum (working platform) or the like, the following advantages can be obtained. That is, it is possible not only to attach the electronic part securely to the substratum or the like, but also to remarkably improve the releasability of the electronic part from the gas-generating, pressure-sensitive adhesive composition upon irradiation of the composition with an ultraviolet radiation (which is generally applied during the processing of the electronic part), so that, after the working (e.g., grinding or cutting) of the electronic part, the electronic part can be easily released from the gas-generating, pressure-sensitive adhesive composition without putting a high load on the electronic part. Accordingly, by the use of the gas-generating, pressure-sensitive adhesive composition of the present invention, the working of an electronic part can be efficiently conducted without causing breakage of the electronic part. The present invention is also concerned with a method for processing an electronic part, such as a precision electronic part, a substrate for an electronic appliance, or a semiconductor part (e.g., a semiconductor wafer) by the use of a specific gas-generating, pressure-sensitive adhesive reagent, such as the above-mentioned gas-generating, pressure-sensitive adhesive composition.

2. Prior Art

In recent years, there has been a growing tendency toward miniaturization of electronic parts, and a large number of electronic parts having a size of less than 1 mm×1 mm (i.e., precision electronic parts) have been produced. As examples of such precision electronic parts, there can be mentioned various types of semiconductor devices, such as a diode, a transistor, a rectifier, a thermistor, a varistor and a thyristor; various types of integrated circuits, such as an IC and an LSI; various types of capacitors, such as a ceramic capacitor, an aluminum capacitor, a mica capacitor, an organic film capacitor and a metallized organic capacitor; organic resistors; various types of crystal devices, such as a crystal oscillator and a crystal filter; and other electronic parts which are generally used, such as a connector, a coil, a transformer, a switch, a magnetic head, a polycrystalline silicon and a TFT (thin film transistor).

On the other hand, with respect to substrates for electronic appliances, there is a tendency toward development of technologies for multi-layering the substrates. Examples of such substrates include a sheet of glass or a polymer (such as a polyphenylene sulfide or a polyimide), and an electrode sheet comprising an electroconductive material, such as silver or copper, wherein precision electronic parts are mounted on the sheet to form a circuit.

Especially, with respect to integrated circuits (IC's), which are incorporated in all electronic appliances, there is a tendency toward miniaturization and improvement in performance, thereby promoting development of IC's having a very high density. For example, a multifunctional device comprising multiple layers of IC chips is currently under development. Further, with respect to semiconductor packages, the mounting of chip-size packages is becoming a standard technology.

In many cases, precision electronic parts have a fine structure or a small thickness. Therefore, during the production or processing of precision electronic parts, a substrate for the precision electronic part or the electronic part per se is temporarily attached to a substratum (working platform) using an adhesive.

For example, when an electronic part (such as a substrate for an electronic appliance) is processed, and transferred to or placed on a substrate to obtain an ultimate article, the electronic part is temporarily attached onto a temporary substratum using an adhesive tape or sheet which has a capability of temporarily but securely attaching the electronic part to the temporary substratum and a capability of releasing the electronic part after the working (e.g., grinding or cutting) of the electronic part.

For example, a multilayer substrate (e.g., a film capacitor) as a substrate for an electronic appliance can be produced as follows. A surface (a) of a substrate is attached onto a surface of an adhesive tape or sheet and, then, the opposite surface (b) of the substrate is worked. The worked surface (b) is attached onto a surface of another adhesive tape or sheet. Then, from the surface (a) of the substrate is released the adhesive tape or sheet to expose the surface (a), and the exposed surface (a) is worked, thereby obtaining a worked substrate (both surfaces of which have been worked). A plurality of such worked substrates are laminated to produce a multilayer substrate.

As seen from the above, in the production of precision electronic parts, adhesives for temporarily attaching the precision electronic parts to a temporary substratum (working platform) have come to play a greater role.

For example, when it is intended to work a precision electronic part, prior to the working thereof, the precision electronic part is securely attached onto an adhesive tape or sheet. After the working of the precision electronic part, it is necessary to release the precision electronic part from the adhesive tape or sheet. During such a working of the precision electronic part, it is required that the adhesive tape or sheet exhibit a high adhesion strength. On the other hand, when the resultant worked precision electronic part is picked up from the adhesive tape or sheet, it is required that the adhesive tape or sheet exhibit a low adhesion strength (i.e., excellent releasability).

A more illustrative explanation is made below, taking as an example the case where the precision electronic part is a semiconductor wafer. Generally, dicing of the semiconductor wafer is conducted by the so-called "direct pickup method". Specifically, in the "direct pickup method", the semiconductor wafer is securely attached onto an adhesive tape (dicing tape), followed by cutting the semiconductor wafer into segments using a rotary blade. Then, the resultant semiconductor wafer segments on the adhesive tape are picked up one by one and mounted on a die. On the other hand, in a grinding (backgrinding) operation conducted for thinning the semiconductor wafer having a circuit formed thereon, the adhesive tape is securely attached onto the circuit-side surface of the semiconductor wafer, and the opposite surface of the semiconductor wafer is ground. In such workings (dicing and backgrinding) of the semiconductor wafer, for preventing the semiconductor wafer from being broken or preventing the semiconductor wafer segments from scattering, it is required that the adhesive tape have a high adhesion strength. On the other hand, when the semiconductor wafer segments are picked up after the above workings, for preventing the semiconductor wafer from being broken, it is required that the adhesive tape have a low adhesion strength (i.e., excellent releasability).

Nowadays, with respect to semiconductor wafers, there is a world-wide trend toward enlargement of diameter and reduction in thickness. As a result, a large number of semiconductor wafers of today are susceptible to breakage due to external force. Therefore, it is now required to develop an adhesive tape which can suppress the load on a semiconductor during the dicing or pick-up thereof. Needless to say, it is most desired to develop an adhesive tape which exhibits absolutely no adhesion strength to a semiconductor wafer during the pickup thereof ("Setchaku (Adhesion)", Vol. 43, No. 1, pp. 22–25, Kobunshi Kankokai Inc., Japan, 1999).

In an attempt to meet the requirement, several adhesive tapes have been proposed. For example, there has been proposed an irradiation-curable adhesive tape comprising an adhesive layer, wherein the adhesion strength of the adhesive tape attached to an adherend can be reduced by curing the adhesive layer by irradiation of the adhesive tape on the substratum with an ultraviolet radiation or an ionizing radiation (e.g., an electron radiation) (Unexamined Japanese Patent Application Laid-Open Specification No. Hei 1-272130). There has also been proposed an adhesive tape comprising a water-soluble polymer as an adhesive component, wherein the adhesive component can be dissolved-out from the adhesive tape by using hot water after the dicing, thereby reducing the adhesion strength of the adhesive tape.

However, the irradiation-curable adhesive tape, even after curing, still exhibits a high adhesion strength to the electronic part and, hence, the releasability of the electronic part from the adhesive tape is unsatisfactory.

In addition, trays conventionally used for transporting or mounting electronic parts also have a problem in that, when the electronic parts are placed on the trays, the electronic parts will move on the trays, so that the electronic parts are likely to be damaged by impact or to be influenced by static electricity. For solving this problem, Unexamined Japanese Patent Application Laid-Open Specification No. Hei 11-334785 discloses an adhesive tape for attaching an electronic part to a carrier (tray) used for transporting or mounting the electronic part. However, the releasability of an electronic part from the adhesive tape disclosed in this patent document is unsatisfactory.

As seen from the above, it has been desired to develop an adhesive composition having an excellent releasability from an electronic part.

SUMMARY OF THE INVENTION

In this situation, the present inventors have made extensive and intensive studies with a view toward developing an adhesive composition for temporarily attaching an electronic part (such as a semiconductor wafer) to a substratum (working platform), which has an excellent releasability from an electronic part and, hence, is advantageous in that, after the electronic part is securely attached to the adhesive composition and worked, the electronic part can be easily released from the adhesive composition without putting a high load on the electronic part.

As a result, it has unexpectedly been found that the desired adhesive composition can be realized by a specific gas-generating, pressure-sensitive adhesive composition comprising: a pressure-sensitive, ultraviolet irradiation-curable adhesive (A) containing a photoinitiator, wherein the adhesive (A) transmits therethrough an ultraviolet radiation; and a gas generator compound (B) which generates a gas upon irradiation thereof with an ultraviolet radiation. More specifically, in the specific gas-generating, pressure-sensitive adhesive composition, the gas generator compound (B) is operably combined with the pressure-sensitive, ultraviolet irradiation-curable adhesive (A), so that, in operation, when the gas-generating, pressure-sensitive adhesive composition which is adhered to an adherend is irradiated with an ultraviolet radiation, the gas generator compound (B) generates a gas and the gas effuses at an interface between the gas-generating, pressure-sensitive adhesive composition and the adherend to thereby facilitate release of the adherend from the gas-generating, pressure-sensitive adhesive composition. Further, in the working (e.g., grinding or cutting) of an electronic part, such as a precision electronic part, a substrate for an electronic appliance, or a semiconductor part (e.g., a semiconductor wafer), when the gas-generating, pressure-sensitive adhesive composition is used as an adhesive for temporarily attaching the electronic part to a substratum (working platform) or the like, various advantageous are brought about. That is, it is possible not only to attach the electronic part securely to the substratum or the like, but also to remarkably improve the releasability of the electronic part from the gas-generating, pressure-sensitive adhesive composition upon irradiation of the composition with an ultraviolet radiation (which is generally applied to in the processing of the electronic part), so that, after the working (e.g., grinding or cutting) of the electronic part, the electronic part can be easily released from the gas-generating, pressure-sensitive adhesive composition without putting a high load on the electronic part. Based on these novel findings, the present invention has been completed.

Accordingly, it is a primary object of the present invention to provide a gas-generating, pressure-sensitive adhesive composition which can be used for efficiently conducting the processing of the electronic part without causing breakage of the electronic part.

It is another object of the present invention to provide a method for efficiently processing an electronic part without causing breakage of the electronic part, wherein a specific gas-generating, pressure-sensitive adhesive reagent, such as the above-mentioned gas-generating, pressure-sensitive adhesive composition, is used.

The foregoing and other objects, features and advantages of the present invention will be apparent from the following detailed description and appended claims taken in connection with the accompanying drawings.

DESCRIPTION OF THE REFERENCE NUMERALS

Figure 1:
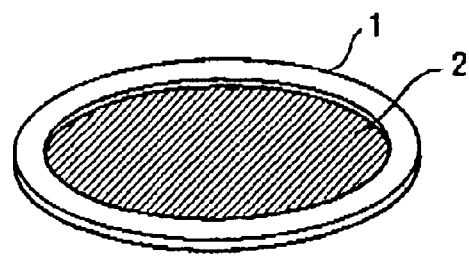
FIG. 1 is a diagrammatic perspective view of a circular adhesive sheet attached to a substratum (working platform) by means of a ring-shaped jig.
Figure 2:
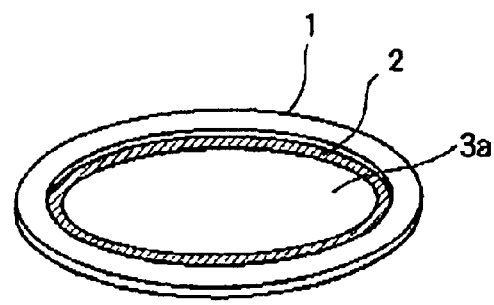
FIG. 2 is a diagrammatic perspective view of the circular adhesive sheet having a semiconductor wafer adhered to the surface thereof.

1 Ring-shaped jig
2 Circular adhesive sheet
3a Semiconductor wafer
3b Segment of the diced semiconductor wafer
4 Rotary blade (two arrows indicate, respectively, the direction of the revolution of the blade and the direction of the movement of the blade)
5 UV lamp
6 Collet
6a Arm portion of the collet
6b Sucking portion of the collet

DETAILED DESCRIPTION OF THE INVENTION

According to the present invention, there is provided a gas-generating, pressure-sensitive adhesive composition comprising:

a pressure-sensitive, ultraviolet irradiation-curable adhesive (A) containing a photoinitiator, wherein the adhesive (A) transmits therethrough an ultraviolet radiation; and a gas generator compound (B) which generates a gas upon irradiation thereof with an ultraviolet radiation, the gas generator compound (B) being operably combined with the pressure-sensitive, ultraviolet irradiation-curable adhesive (A), so that, in operation, when the gas-generating, pressure-sensitive adhesive composition which is adhered to an adherend is irradiated with an ultraviolet radiation, the gas generator compound (B) generates a gas and the gas effuses at an interface between the gas-generating, pressure-sensitive adhesive composition and the adherend to thereby facilitate release of the adherend from the gas-generating, pressure-sensitive adhesive composition.

For easy understanding of the present invention, important features and various embodiments of the present invention are enumerated below.

1. A gas-generating, pressure-sensitive adhesive composition comprising:

a pressure-sensitive, ultraviolet irradiation-curable adhesive (A) containing a photoinitiator, wherein the adhesive (A) transmits therethrough an ultraviolet radiation; and a gas generator compound (B) which generates a gas upon irradiation thereof with an ultraviolet radiation, the gas generator compound (B) being operably combined with the pressure-sensitive, ultraviolet irradiation-curable adhesive (A), so that, in operation, when the gas-generating, pressure- sensitive adhesive composition which is adhered to an adherend is irradiated with an ultraviolet radiation, the gas generator compound (B) generates a gas and the gas effuses at an interface between the gas-generating, pressure-sensitive adhesive composition and the adherend to thereby facilitate release of the adherend from the gas-generating, pressure-sensitive adhesive composition.

2. The gas-generating, pressure-sensitive adhesive composition according to item 1 above, wherein the gas generator compound (B) is a compound having an azido group.

3. The gas-generating, pressure-sensitive adhesive composition according to item 2 above, wherein the gas generator compound (B) is a compound having an organic azido group.

4. The gas-generating, pressure-sensitive adhesive composition according to item 3 above, wherein the gas generator compound (B) is a compound having an azidomethyl group.

5. The gas-generating, pressure-sensitive adhesive composition according to item 1 above, wherein the gas generator compound (B) is at least one compound selected from the group consisting of 3-azidomethyl-3-methyloxetane, 3,3-bis(azidomethyl)oxetane and a glycidyl azide polymer.

6. The gas-generating, pressure-sensitive adhesive composition according to item 5 above, wherein the gas generator compound (B) is a glycidyl azide polymer.

7. The gas-generating, pressure-sensitive adhesive composition according to item 1 above, wherein the adhesive (A) comprises at least one compound selected from the group consisting of a rubber polymer, an acrylic polymer, a polyether, a polyester, a polyisocyanate and a polyurethane.

8. The gas-generating, pressure-sensitive adhesive composition according to item 7 above, wherein the adhesive (A) further comprises a photopolymerizable oligomer.

9. The gas-generating, pressure-sensitive adhesive composition according to item 1 above, which is in the form of a sheet or a tape.

10. The gas-generating, pressure-sensitive adhesive composition according to item 9 above, which has a thickness of from 0.005 to 1 mm.

The present invention will now be described in detail.

The gas-generating, pressure-sensitive adhesive composition of the present invention is a composition comprising a pressure-sensitive adhesive (A) and a gas generator compound (B).

With respect to the pressure-sensitive adhesive (A) used in the present invention, there is no particular limitation so long as the adhesive (A) is an adhesive capable of transmitting therethrough a radiation selected from the group consisting of an electromagnetic radiation, an electron radiation and an alpha radiation. Examples of electromagnetic radiations include a visible radiation, an ultraviolet radiation, an X-radiation and a γ-radiation. Examples of the adhesive (A) include rubbery polymers, such as unsaturated rubbers (e.g., a polyisobutylene and a butyl rubber) and saturated rubbers (e.g., an ethylene/propylene(/diene) copolymer rubber, an olefin block copolymer rubber and an acrylic rubber); acrylic polymers, such as a copolymer of an acrylic ester and a functional group-containing monomer; polyethers; polyesters; and polyurethanes. In the present invention, it is particularly preferred that the pressure sensitive adhesive (A) contains a photopolymerizable oligomer. It is preferred that the photopolymerizable oligomer has a polyether skeleton, a polyester skeleton, an epoxy resin skeleton, a polycarbonate skeleton, a polybutadiene skeleton, a polyurethane skeleton or the like, and has at least two functional groups, such as an acryloyl group ($CH_2$=CHO—) and a methacryloyl group ($CH_2$=C($CH_3$)CO—). Specific examples of photopolymerizable oligomers include oligomers of an epoxy acrylate, a polyether acrylate, a polyester acrylate, a urethane acrylate and the like. These oligomers are known as representative examples of ultraviolet-curable resins, and are generally used for forming protective coatings for optical fibers or electric wires.

The above-mentioned polymers can be used individually or in combination, with respect to the above-mentioned polymers used as the pressure-sensitive adhesive (A), the weight average molecular weight thereof is generally in the range of from 500 to 3,000,000. The pressure sensitive adhesive (A) may optionally comprise a crosslinking agent, such as a polyisocyanate or an alkyl etherified melamine compound, in addition to the polymer used as a base polymer. In the present invention, the weight average molecular weight can be measured by gel permeation chromatography (GPC).

In the present invention, it is preferred that the pressure sensitive adhesive (A) is curable upon irradiation thereof with the above-mentioned radiation, especially, an ultraviolet radiation. The reason for this is as follows. Ultraviolet-curable adhesives generally have high adhesion strength and, hence, are suitable for use in attaching a precision electronic part to a substrate. In addition, upon irradiation with an ultraviolet radiation, the ultraviolet-curable adhesive is cured, so that the adhesion strength of the ultraviolet-curable adhesive attached to the adherend is lowered and, hence, the precision electronic part can be easily picked up.

As a specific example of ultraviolet-curable adhesives, there can be mentioned an adhesive obtained by mixing together:

(a) at least one base polymer selected from the group consisting of acrylic polymers (such as copolymers of ethyl acrylate, butyl acrylate, 2-ethylhexyl acrylate, hydroxymethyl acrylate and the like), polyethers and polyesters; and (b) a photopolymerizable oligomer, such as a urethane oligomer, an ether oligomer, an ester oligomer, a carbonate oligomer and a butadiene oligomer; and optionally, (c) a photoinitiator, such as 1-hydroxycyclohexyl phenyl ketone, isopropylbenzoin ether, benzophenone, xanthone or the like, and/or (d) a crosslinking agent, such as an epoxy-containing crosslinking agent, an aziridine-containing crosslinking agent or an isocyanate group-containing crosslinking agent.

The amounts of the above-mentioned components of the ultraviolet-curable adhesive can be appropriately selected, taking into consideration the curing reactivity which the adhesive exhibits upon irradiation thereof with an ultraviolet irradiation. The amount of the component (c) is generally in the range of from 0.1 to 20 parts by weight, preferably 1 to 5 parts by weight, relative to 100 parts by weight of the component (a). The total amount of the components (b) and (d) is generally in the range of from 2 to 200 parts by weight, preferably 20 to 150 parts by weight, more preferably 50 to 100 parts by weight, relative to 100 parts by weight of the component (a).

Further, the above-mentioned ultraviolet-curable adhesive may optionally contain:

(e) an ultraviolet-curable compound other than mentioned above, such as a polyacrylate of an aliphatic polyol.

Among the ultraviolet-curable adhesives usable as the adhesive (A) in the present invention, it is desired to use an ultraviolet-curable adhesive which, when cured upon irradiation with an ultraviolet radiation, not only forms therein a three-dimensional network of pores, but also exhibits a favorable level of flexibility.

As mentioned above, the gas-generating, pressure-sensitive adhesive composition of the present invention contains the gas generator compound (B). By virtue of the gas generator compound (B), the gas-generating, pressure-sensitive adhesive composition has the following advantage. When an electronic part (such as a semiconductor wafer) temporarily attached to a substratum (working platform) through the gas-generating, pressure-sensitive adhesive composition is worked, and, then, the gas-generating, pressure-sensitive adhesive composition is irradiated with the above-mentioned radiation, the gas generator compound (B) generates a gas and the gas effuses at an interface between the gas-generating, pressure-sensitive adhesive composition and the electronic part to thereby facilitate release of the electronic part from the gas-generating, pressure-sensitive adhesive composition. That is, upon the irradiation of the gas-generating, pressure-sensitive adhesive composition with the radiation, a gas, such as nitrogen gas, is generated from the inside of the gas-generating, pressure-sensitive adhesive composition by decomposition of the gas generator compound (B), and the generated gas not only reduces the area of contact between the electronic part and the gas-generating, pressure-sensitive adhesive composition, but also pressurizes the space between the electronic part and the gas-generating, pressure-sensitive adhesive, thereby remarkably improving the releasability of the electronic part from the gas-generating, pressure-sensitive adhesive composition. Thus, it becomes possible to release the electronic part (which has been worked) from the gas-generating, pressure-sensitive adhesive composition without putting a mechanical or thermal load on the electronic part. As the gas generator compound (B), it is preferred to use a compound having an azido group, since an azido group is decomposed upon absorption of a light radiation (especially an electromagnetic radiation, such as an ultraviolet radiation) to release a stable molecular nitrogen gas. That is, the use of an azido group-containing compound as the gas generator compound (B) is advantageous in that, upon irradiation of the gas-generating, pressure-sensitive adhesive composition with the radiation, nitrogen gas is generated from the inside of the gas-generating, pressure-sensitive adhesive composition by decomposition of an azido group contained in the gas generator compound (B), and the nitrogen gas effuses at an interface between the electronic part and the gas-generating, pressure-sensitive adhesive composition, so that the generated nitrogen gas not only reduces the area of contact between the electronic part and the gas-generating, pressure-sensitive adhesive composition, but also pressurizes the space between the electronic part and the gas-generating, pressure-sensitive adhesive composition, thereby facilitating to release the electronic part from the gas-generating, pressure-sensitive adhesive composition. Thus, it becomes possible to remarkably improve the releasability of the electronic part from the gas-generating, pressure-sensitive adhesive composition.

Examples of azido group-containing compounds include sodium aside. Further examples of azido group-containing compounds include those which are described in A. M. Helmy et al., "Investigation of New Energetic Ingredient for Minimum Signature Propellants", 20th Joint Propulsion Conference (Ohio, 1984). Specific examples of such compounds include 1,6-diazido-2,5-dinitrazahexane, 1,2-diazido-3-fluorodinitroethoxypropane, 3-azido-2,2-dinitropropyl-2,3-diazidopropyl ether, and 3-azido oxetane. The object of this document is to improve performance of explosives and, hence, this document enumerates compounds which contain not only an azido group but also a nitro group. However, in the present invention, the azido group-containing compounds need not contain a nitro group. From the viewpoint of uniformly dispersing the gas generator compound (B) in the gas-generating, pressure-sensitive adhesive composition, it is preferred to use an organic compound in a liquid form as the gas generator compound (B). Further, from the viewpoint of ease in synthesis, safety in handling and the like, it is especially preferred to use a compound having an azidomethyl group as the gas generator compound (B).

Examples of monomers having an azidomethyl group include AMMO (3-azidomethyl-3-methyloxetane) and BAMO (3,3-bis(azidomethyl)oxetane). Examples of polymers having an azidomethyl group include GAP (glycidyl azide polymer). These azidomethyl group-containing compounds are preferred in that the compounds have a decomposition temperature of 250° C. or higher and are easy and safe to handle. The above-mentioned monomers can also be used not only in the form of homopolymers thereof but also in the form of copolymers thereof with other compounds, such as tetrahydrofuran and oxetane compounds other than mentioned above.

With respect to the mechanism of the decomposition of the azidomethyl group-having compound upon irradiation thereof with an ultraviolet radiation, the present inventors have made a study from the viewpoint of safety in handling. The results of the study are disclosed in "Kogyo Kayaku (Industrial Explosives)", Vol. 51, No. 4, pp. 240–245, published by the Industrial Explosives Society, Japan, 1990.

In the gas-generating, pressure-sensitive adhesive composition of the present invention, when a polymer, such as the above-mentioned GAP, is used as the gas generator compound (B), the weight average molecular weight of the polymer is generally 10,000 or less, preferably from 500 to 8,000, more preferably from 2,000 to 5,000.

The ratio of the gas generator compound (B) to the adhesive (A) is appropriately chosen, taking into consideration the desired levels of the adhesion strength and releasability, and the like.

For example, when the adhesive (A) is the above-mentioned ultraviolet radiation-curable adhesive containing the component (a), the ratio of the gas generator compound (B) to the adhesive (A) is appropriately chosen, taking into consideration the compatibility of the gas generator compound (B) with the other component(s), the amount of the gas to be generated, and the safety in handling. Specifically, the amount of the gas generator compound (B) is generally from 1 to 300 parts by weight, preferably from 5 to 200 parts by weight, more preferably from 10 to 100 parts by weight, relative to 100 parts by weight of the adhesive (A).

When the gas-generating, pressure-sensitive adhesive composition of the present invention is used in the processing of an electronic part, it is preferred that the gas-generating, pressure-sensitive adhesive composition is in the form of a tape or a sheet. When the gas-generating, pressure-sensitive adhesive composition is in the form of a tape, the gas-generating, pressure-sensitive adhesive composition can be stored in the form of a rolled tape. Such a tape or sheet of the gas-generating, pressure-sensitive adhesive composition is generally provided in the form of a gas-generating, pressure sensitive hybrid which can be obtained by applying the gas-generating, pressure-sensitive adhesive composition of the present invention to an irradiation-transmitting substratum in the form of a sheet or a tape, to thereby form a coating on the substratum. The thus obtained tape or sheet of the gas-generating, pressure-sensitive adhesive composition has various advantages. One of the advantages resides in that, in the processing of an electronic part using such an adhesive composition, it is possible to use the same apparatuses as used in a conventional method for processing the electronic part using a conventional adhesive in the form of a tape or a sheet (such as a conventional ultraviolet radiation-curable adhesive tape).

Examples of substrata include rubbers or thermoplastic resins which transmit an electromagnetic radiation and which are in the form of a tape (film) or a sheet. Examples of such rubbers and thermoplastic resins include olefin polymers, such as a polyethylene, a polypropylene, an ethylene/propylene copolymer, an ethylene/acrylate copolymer, an ethylene/acrylic acid copolymer, an ionomer, a poly(1-butene) and an ethylene/vinyl acetate copolymer; polyesters; polycarbonates; and PMMA (polymethyl methacrylate).

The thickness of the substratum is preferably from about 10 to about 200 μm, with respect to the thickness of the coating of the gas-generating, pressure-sensitive adhesive composition formed on the substratum, the thickness is preferably from 0.005 to 1 mm, more preferably from 0.01 to 0.5 mm, from the viewpoint of the effectiveness of the gas generated upon the irradiation. When the thickness of the coating is larger than 1 mm, disadvantages are likely to be caused wherein bubbles of the generated gas are trapped inside the coating of the gas-generating, pressure-sensitive adhesive composition, so that the generated gas cannot be effectively used for releasing the electronic part from the coating of the gas-generating, pressure-sensitive adhesive composition.

When the gas-generating, pressure-sensitive adhesive composition of the present invention is irradiated with the radiation, the amount of the irradiation varies depending on the types and amounts of the pressure-sensitive adhesive (A), the gas generator compound (B) and the photopolymerizable oligomer, and the like. However, when the radiation is an electron radiation, an alpha radiation or a gamma radiation, the amount of the irradiation is generally from 0.5 to 20 Mrad; when the radiation is an ultraviolet radiation, the amount of the irradiation is generally from 10 to 3,000 mJ/cm$^2$, preferably from 30 to 2,000 mJ/cm$^2$, more preferably from 50 to 500 mJ/cm$^2$.

The irradiation time can be adjusted by appropriately controlling the amount of the irradiation. In general, the irradiation time is preferably about 10 seconds.

The gas-generating, pressure-sensitive adhesive composition of the present invention can be used in various application fields. For example, in a process for producing a substrate for an electronic appliance, such as a multilayer substrate (e.g., a film capacitor), the gas-generating, pressure-sensitive adhesive composition can be used for protecting the substrate, or temporarily attaching the substrate to a working platform or the like. Further, in a process for producing a flexible display, in which a TFT (thin film transistor) for a picture element is transferred from a glass substrate to a plastic substrate, the gas-generating, pressure-sensitive adhesive composition can be used for temporarily attaching the TFT onto a temporary substratum, or for masking.

Hereinbelow, a detailed explanation is made with respect to the method of the present invention for processing an electronic part by using a gas-generating, pressure-sensitive adhesive reagent, such as the gas-generating, pressure-sensitive adhesive composition of the present invention.

According to another aspect of the present invention, there is provided a method for processing an electronic part, comprising:

(1) applying a gas-generating, pressure-sensitive adhesive reagent to a surface of a substratum to provide a gas-generating, pressure-sensitive adhesive hybrid, wherein the gas-generating, pressure-sensitive adhesive reagent generates a gas upon irradiation thereof with a radiation selected from the group consisting of an electromagnetic radiation, an electron radiation and an alpha radiation, and wherein the substratum transmits the irradiation;

(2) securely attaching one surface of an electronic part onto a gas-generating, pressure-sensitive adhesive reagent-side surface of the gas-generating, pressure-sensitive adhesive hybrid, wherein the other surface of the electronic part is left exposed;

(3) working the exposed surface of the electronic part;

(4) irradiating the gas-generating, pressure-sensitive adhesive reagent with the radiation through the substratum, to thereby cause the pressure-sensitive adhesive reagent to generate a gas, so that the gas effuses at an interface between the gas-generating, pressure-sensitive adhesive reagent and the electronic part; and (5) detaching the electronic part from the adhesive hybrid.

In the present invention, the term "electronic part" means, for example, a precision electronic part, a substrate for an electronic appliance, a semiconductor part or the like. Specific examples of precision electronic parts include semiconductor devices, such as a diode, a transistor, a rectifier element, a thermistor, a varistor and a thyristor; integrated circuits, such as an IC and an LSI; capacitors, such as a ceramic capacitor, an aluminum capacitor, a mica capacitor, an organic film capacitor and a metallized organic capacitor; organic resistors; crystal devices, such as a crystal oscillator and a crystal filter; and other electronic parts which are generally used, such as a connector, a coil, a transformer, a switch, a magnetic head, a polycrystalline silicon and a TFT (thin film transistor). Specific examples of substrates for electronic appliances include a sheet of a glass, a polymer (such as a polyphenylene sulfide or a polymide) or an electrode (i.e., an electric conductor, such as silver or copper), wherein precision electronic parts are mounted on the sheet to form a circuit. Specific examples of semiconductor parts include semiconductor wafers, such as a silicon wafer.

Examples of gas-generating, pressure-sensitive adhesive reagents used in the method of the present invention include the gas-generating, pressure-sensitive adhesive composition of the present invention.

Examples of gas-generating, pressure-sensitive adhesive hybrids used in the method of the present invention include an adhesive sheet or tape which is obtained by forming a coating of the gas-generating, pressure-sensitive adhesive composition on the surface of the above-mentioned radiation-transmitting substratum. Further, in the method of present invention, the substratum may be a working platform or the like generally used for processing an electronic part.

In the method of the present invention, a gas-generating, pressure-sensitive adhesive polymer which generates a gas upon irradiation thereof with a radiation selected from the group consisting of an electromagnetic radiation, an electron radiation and an alpha radiation can be used alone as a gas-generating, pressure-sensitive adhesive reagent. Examples of such gas-generating, pressure-sensitive adhesive polymers include an azido group-containing polymer having a weight average molecular weight of 2,300 or more, preferably 10,000 or more, more preferably from 10,000 to 1,000,000, most preferably from 10,000 to 100,000. When the weight average molecular weight of the polymer is 10,000 or less, the polymer can be crosslinked using a crosslinking agent, such as a polyisocyanate. Specific examples of the above-mentioned polymers include the above-mentioned glycidyl azide polymer (GAP), a polymer of the above-mentioned AMMO and a polymer of the above-mentioned BAMO.

In the case where the electronic part is a semiconductor part, examples of workings conducted in step (3) of the method of the present invention include (i) a grinding (such as backgrinding) of the exposed surface of the semiconductor part, and (ii) a cutting (such as dicing) of the semiconductor part in a thicknesswise direction thereof from the exposed surface of the semiconductor part.

Examples of electromagnetic radiations used in step (4) of the method of the present invention include a visible radiation, an ultraviolet radiation, an X-radiation and a γ-radiation. As the radiation in step (4), an ultraviolet radiation is especially preferred.

With respect to one mode of the method of the present invention for processing an electronic part, an explanation is made below with reference to FIGS. 1 to 6.

Figure 3:
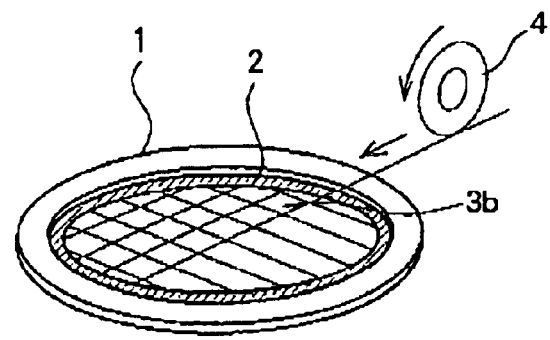
FIG. 3 is a diagrammatic perspective view of the circular adhesive sheet having a semiconductor wafer adhered to the surface thereof, in which the semiconductor wafer is being diced.
Figure 4:
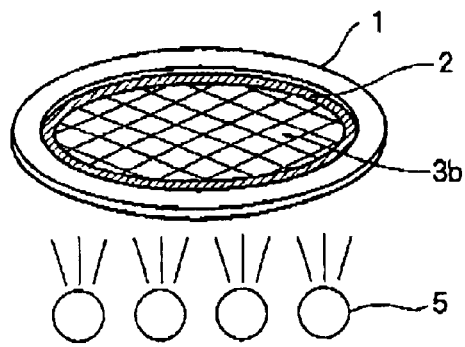
FIG. 4 is a diagrammatic perspective view of the circular adhesive sheet having a diced semiconductor wafer adhered to the surface thereof, in which the adhesive sheet is being irradiated with a UV radiation.
Figure 5:
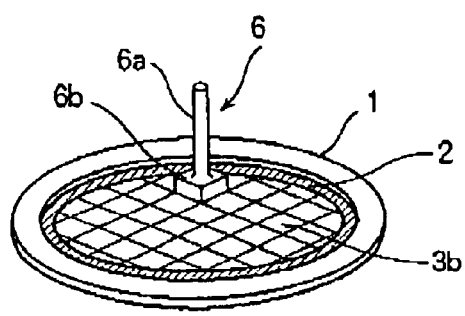
FIG. 5 is a diagrammatic perspective view of the UV-irradiated adhesive sheet having the diced semiconductor wafer placed thereon, in which a collet has been brought into contact with a target segment of the diced wafer so as to collect the target segment by suction.
Figure 6:
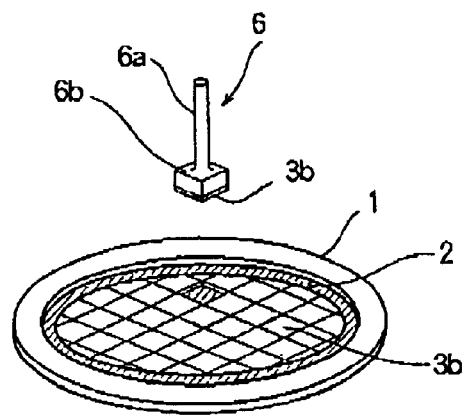
FIG. 6 is a diagrammatic perspective view of the UV-irradiated adhesive sheet having the diced semiconductor wafer placed thereon, in which the target segment of the diced wafer has been picked up by the collet.

First, circular adhesive sheet (2) (i.e., gas-generating, pressure-sensitive adhesive hybrid which is obtained by applying a gas-generating, pressure-sensitive adhesive reagent to a surface of a radiation-transmitting substratum) is secured onto a working platform or the like using a ring-shaped jig (1) so that a gas-generating, pressure-sensitive adhesive reagent-side surface of circular adhesive sheet (2) faces upward (see FIG. 1) Next, semiconductor wafer (3a) is securely attached to circular adhesive sheet (2) (see FIG. 2), and semiconductor wafer (3a) is cut into semiconductor elements (i.e., resultant wafer fragments (3b)) having a desired morphology by using rotary circular blade (4) (see FIG. 3). Subsequently, the gas-generating, pressure-sensitive adhesive reagent is irradiated with an ultraviolet radiation through the radiation-transmitting substratum, to thereby cause the pressure-sensitive adhesive reagent to generate a gas, so that the gas effuses at an interface between the gas-generating, pressure-sensitive adhesive reagent and semiconductor wafer (3a) so as to thereby facilitate release of wafer fragment (3b) from circular adhesive sheet (2) (see FIG. 4). Then, wafer fragment (3b) is picked up using collet (6) (see FIGS. 5 and 6).

The gas-generating, pressure-sensitive adhesive hybrid as obtained in step (1) of the method of the present invention can also be used for transporting and mounting electronic parts by the method disclosed in Unexamined Japanese Patent Application Laid-Open Specification No. Hei 11-334785.

BEST MODE FOR CARRYING OUT THE INVENTION

Hereinbelow, the present invention will be described in more detail with reference to the following Examples and Comparative Example; however, they should not be construed as limiting the scope of the present invention.

In the following Examples and Comparative Example, the releasability of a thin glass plate from a coating of a pressure-sensitive adhesive is evaluated by a method in which a thin glass plate having a thickness of about 0.15 mm is attached onto a coating of a pressure-sensitive adhesive and, then, the glass plate is released from the coating, wherein the thin glass plate is used as a substitute for an electronic part.

EXAMPLE 1
(In which a Glycidyl Azide Polymer (GAP), which is a Polymer having an Azido Group, was Solely Used as a Gas Generator Compound)

A glycidyl azide polymer (GAP) having a weight average molecular weight of about 2,500 and having OH groups at both terminals thereof was synthesized in accordance with a method disclosed in U.S. Pat. No. 4,268,450. The GAP was spread over a substratum to form a thin coating having a thickness of about 3 mm. On the resultant GAP coating was placed a cover glass (for microscope observation) (width and length: 18 mm×18 mm, thickness: about 0.15 mm). The GAP coating was irradiated with an ultraviolet radiation (115 V, 60 Hz, 0.16 A) by means of a UV lamp (MODEL UVGL-58, manufactured and sold by San Gabriel, U.S.A.) for about 10 minutes, wherein the irradiation was conducted from a position about 1 cm above the glass plate. As a result, a number of nitrogen gas bubbles generated from the GAP coating were observed at an interface between the glass plate and the GAP coating. Thus, it was confirmed that nitrogen gas generated from the GAP coating had reduced an area of contact between the glass plate and the GAP coating.

EXAMPLE 2
(In which a Glycidyl Azide Polymer (GAP), which is a Polymer having an Azido Group, was Used in Combination with a Compound Serving as a Crosslinking Agent)

100 g of a glycidyl azide polymer (GAP) (having a weight average molecular weight of about 2,500 and having OH groups at both terminals thereof) synthesized in substantially the same manner as in Example 1 was placed in a mold having its surface covered with a Teflon sheet. To the GAP were added and mixed well 3.6 g of IPDI (isophorone diisocyanate) (VESTANATA IPDI, manufactured and sold by Degussa-Hüls Japan Co., Ltd., Japan) and 8.7 g of TPA-100 (one product of DURANATE series, manufactured and sold by ASAHI KASEI Corporation, Japan) which is a trifunctional isocyanate and an adduct of hexamethylene diisocyanate (which IPDI and TPA-100 were used as a crosslinking agent), thereby obtaining a gas-generating, pressure-sensitive adhesive composition. The obtained gas-generating, pressure-sensitive adhesive composition was spread over the Teflon sheet in the mold to form a thin coating having a thickness of about 2.5 mm. The gas-generating, pressure-sensitive adhesive composition coating formed on the Teflon sheet was heated at 60° C. for about 4 days to effect a curing reaction, thereby obtaining a cured polymer coating formed on the Teflon sheet. On the cured polymer coating was placed the same glass plate as used in Example 1 so as to adhere the glass plate to the cured polymer coating. Then, the cured polymer coating having the glass plate adhered thereto was irradiated with an ultraviolet radiation in substantially the same manner as in Example 1. As a result, it was observed that a gas was generated from the cured polymer coating, and the gas effused at an interface between the cured polymer coating and the glass plate, so that, several minutes later, the glass plate was partially released from the cured polymer coating. The glass plate could be easily detached from the cured polymer coating by hand.

In this Example 2, as mentioned above, the preparation of the above-mentioned gas-generating, adhesive composition was performed by mixing together well the above-mentioned GAP and the crosslinking agent in a mold having its surface covered with a Teflon sheet for preventing the gas-generating, adhesive composition from adhering to the mold. After the irradiation with the ultraviolet radiation, it was observed that, due to the gas generated from the cured polymer coating, partial release occurred also at the interface between the Teflon sheet and the cured polymer coating.

In the cured polymer coating about ten and several gas bubbles were generated per 1 $cm^2$ (most of the bubbles had a diameter of from 1 to 2 mm). It was confirmed that by virtue of the high uniformity of the dispersion of the organic aside contained in the cured polymer coating, the gas generated in the cured polymer coating is less likely to be trapped within the cured polymer coating and is more likely to effuse at the interface between the cured polymer coating and the glass plate and the interface between the cured polymer coating and the Teflon sheet, thereby facilitating release of the glass plate and Teflon sheet from the cured polymer coating.

From the results of Example 2, it was found that, when the cured polymer coating has a thickness of more than 1 mm, bubbles (namely, the gas trapped in the cured polymer coating) are likely to be formed within the cured polymer coating. Therefore, it was confirmed that, for more effectively utilizing the generated gas in order to facilitate the release of the glass plate and Teflon sheet from the cared polymer coating, the cured polymer coating is desired to have a thickness of 1 mm or less.

EXAMPLE 3
(In which a Glycidyl Aside Polymer (GAP), which is a Polymer having an Azido Group, was Used in Combination with an Ultraviolet-curable Resin)

A glycidyl azide polymer (GAP) having a weight average molecular weight of about 2,500 and having OH groups at both terminals thereof was synthesized in the same manner as in Example 1. The obtained GAP and an APR resin (photosensitive resin manufactured and sold by ASAHI KASEI Corporation, Japan, which is a polyurethane resin modified with a carboxylic acid) were mixed In a weight ratio of 1:1 to obtain a gas-generating, pressure-sensitive adhesive composition. The obtained gas-generating, pressure-sensitive adhesive composition was spread over a substratum to form a thin coating having a thickness of about 2.5 mm. On the gas-generating, pressure-sensitive adhesive composition coating was placed the same glass plate as used in Example 1 so as to adhere the glass plate to the gas-generating, pressure-sensitive adhesive composition coating. Then, the gas-generating, pressure-sensitive adhesive composition coating having the glass plate adhered thereto was irradiated with an ultraviolet radiation in substantially the same manner as in Example 1 so as to cure the gas-generating, pressure-sensitive adhesive composition coating. As a result, it was observed that a gas was generated from the gas-generating, pressure-sensitive adhesive composition coating during and after the curing thereof. Then, the cured coating was exposed to the sunlight (which contains an ultraviolet radiation having a high intensity as compared to that used in Example 1) for about 30 minutes. As a result, it was observed that the glass plate was partially released from the cured coating. From the cured coating, the glass plate could be easily detached intact by hand.

Comparative Example 1

Substantially the same procedure as in Example 3 was repeated, except that PPG (polypropylene glycol) was used instead of the GAP. With respect to the coating having the glass plate adhered thereto, even after the curing of the coating and the exposure of the coating to the sunlight, the glass plate remained adhered to the coating. When it was attempted to detach the glass plate from the cured coating, the glass plate was broken.

INDUSTRIAL APPLICABILITY

In the gas-generating, pressure-sensitive adhesive composition of the present invention, the gas generator compound (B) is operably combined with the pressure-sensitive adhesive (A), so that, in operation, when the gas-generating, pressure-sensitive adhesive composition which is adhered to an adherend is irradiated with a radiation, the gas generator compound (B) generates a gas and the gas effuses at an interface between the gas-generating, pressure-sensitive adhesive composition and the adherend to thereby facilitate release of the adherend from the gas-generating, pressure-sensitive adhesive composition. Therefore, in the working (e.g., grinding or cutting) of an electronic part, such as a precision electronic part, a substrate for an electronic appliance, or a semiconductor part (e.g., a semiconductor wafer), when the gas-generating, pressure-sensitive adhesive composition of the present invention is used as an adhesive for temporarily attaching the electronic part to a substratum (working platform) or the like, various advantages can be obtained. That is, it is possible not only to attach the electronic part securely to the substratum or the like, but also to remarkably improve the releasability of the electronic part from the gas-generating, pressure-sensitive adhesive composition upon irradiation of the composition with a radiation (which is generally applied to in the processing of the electronic part), so that, after the working (e.g., grinding or cutting) of the electronic part, the electronic part can be easily released from the gas-generating, pressure-sensitive adhesive composition without putting a high load to the electronic part. Accordingly, by the use of the gas-generating, pressure-sensitive adhesive composition of the present invention, the processing of an electronic part can be efficiently conducted without causing breakage of the electronic part.

In the method of the present invention for processing an electronic part, such as a precision electronic part, a substrate for an electronic appliance, or a semiconductor part (e.g., a semiconductor wafer), which method uses a specific gas-generating, pressure-sensitive adhesive reagent, such as the above-mentioned gas-generating, pressure-sensitive adhesive composition, an appropriate type of the gas-generating, pressure-sensitive adhesive reagent can be chosen, taking into consideration the type of the electronic part to be processed, the conditions for processing and the like. Examples of gas-generating, pressure-sensitive adhesive reagents include: (i) a gas-generating, pressure-sensitive polymer which generates a gas upon irradiation thereof with a radiation selected from the group consisting of an electromagnetic radiation, an electron radiation and an alpha radiation (see Example 1); (ii) a gas-generating, pressure-sensitive composition comprising the adhesive (A) and crosslinking agents (see Example 2); and (iii) a gas-generating, pressure-sensitive composition comprising the adhesive (A) and a polymer curable upon irradiation thereof with a radiation, such as an ultraviolet radiation.

What is claimed is:

1. A gas-generating, pressure-sensitive adhesive composition comprising:

a pressure-sensitive, ultraviolet irradiation-curable adhesive (A) containing a photoinitiator, wherein said adhesive (A) transmits therethrough an ultraviolet radiation; and a gas generator compound (B) which generates a gas upon irradiation thereof with an ultraviolet radiation, said gas generator compound (B) being operably combined with said pressure-sensitive, ultraviolet irradiation-curable adhesive (A), so that, in operation, when the gas-generating, pressure-sensitive adhesive composition which is adhered to an adherend is irradiated with an ultraviolet radiation, the gas generator compound (B) generates a gas and the gas effuses at an interface between the gas-generating, pressure-sensitive adhesive composition and the adherend to thereby facilitate release of the adherend from the gas-generating, pressure-sensitive adhesive composition.

2. The gas-generating, pressure-sensitive adhesive composition according to claim 1, wherein said gas generator compound (B) is a compound having an azido group.

3. The gas-generating, pressure-sensitive adhesive composition according to claim 2, wherein said gas generator compound (B) is a compound having an organic azido group.

4. The gas-generating, pressure-sensitive adhesive composition according to claim 3, wherein said gas generator compound (B) is a compound having an azidomethyl group.

5. The gas-generating, pressure-sensitive adhesive composition according to claim 1, wherein said gas generator compound (B) is at least one compound selected from the group consisting of 3-azidomethyl-3-methyloxetane, 3,3-bis(azidomethyl)oxetane and a glycidyl azide polymer.

6. The gas-generating, pressure-sensitive adhesive composition according to claim 5, wherein said gas generator compound (B) is a glycidyl azide polymer.

7. The gas-generating, pressure-sensitive adhesive composition according to claim 1, wherein said adhesive (A) comprises at least one compound selected from the group consisting of a rubber polymer, an acrylic polymer, a polyether, a polyester, a polyisocyanate and a polyurethane.

8. The gas-generating, pressure-sensitive adhesive composition according to claim 7, wherein said adhesive (A) further comprises a photopolymerizable oligomer.

9. The gas-generating, pressure-sensitive adhesive composition according to claim 1, which is in the form of a sheet or a tape.

10. The gas-generating, pressure-sensitive adhesive composition according to claim 9, which has a thickness of from 0.005 to 1 mm.

* * * * *